(12) United States Patent
Lou

(10) Patent No.: US 8,975,943 B2
(45) Date of Patent: Mar. 10, 2015

(54) COMPACT LEVEL SHIFTER

(71) Applicant: Silanna Semiconductor U.S.A., Inc., San Diego, CA (US)

(72) Inventor: Perry Lou, Carlsbad, CA (US)

(73) Assignee: Silanna Semiconductor U.S.A., Inc., San Diego, CA (US)

( * ) Notice: Subject to any disclaimer, the term of this patent is extended or adjusted under 35 U.S.C. 154(b) by 0 days.

(21) Appl. No.: 13/904,941

(22) Filed: May 29, 2013

(65) Prior Publication Data

US 2014/0354342 A1 Dec. 4, 2014

(51) Int. Cl.
*H03L 5/00* (2006.01)
*H03K 19/0175* (2006.01)

(52) U.S. Cl.
CPC .................. *H03K 19/017509* (2013.01)
USPC .............. 327/333; 327/112; 326/81

(58) Field of Classification Search
USPC .......... 327/112, 217, 333; 326/63, 68, 80, 81; 365/189.11
See application file for complete search history.

(56) References Cited

U.S. PATENT DOCUMENTS

| | | | |
|---|---|---|---|
| 4,845,381 A | 7/1989 | Cuevas | |
| 5,057,718 A | 10/1991 | Proebsting | |
| 5,517,148 A | 5/1996 | Yin | |
| 6,255,875 B1 | 7/2001 | Gabara | |
| 6,353,345 B1 * | 3/2002 | Yushan et al. | 327/112 |
| 6,965,254 B2 | 11/2005 | Lundberg | |
| 7,248,076 B2 | 7/2007 | Chen et al. | |
| 7,460,852 B2 | 12/2008 | Burgener et al. | |
| 7,504,862 B2 | 3/2009 | De Sandre et al. | |
| 7,777,523 B1 | 8/2010 | Masleid et al. | |
| 7,881,756 B2 | 2/2011 | Park et al. | |
| 7,902,871 B2 | 3/2011 | Noh et al. | |
| 8,115,514 B2 | 2/2012 | Deng | |
| 2003/0107425 A1 * | 6/2003 | Yushan | 327/333 |
| 2011/0006828 A1 * | 1/2011 | Chen et al. | 327/333 |
| 2013/0049808 A1 | 2/2013 | Panov | |

OTHER PUBLICATIONS

US 8,174,303, 10/2012, Kim et al. (withdrawn).

* cited by examiner

*Primary Examiner* — Long Nguyen
(74) *Attorney, Agent, or Firm* — The Mueller Law Office, P.C.

(57) ABSTRACT

Embodiments of the present invention provide a device for level shifting an input signal. The device includes an output buffer that has: an output node, a p-FET coupled to a high reference voltage, and an n-FET coupled to a low reference voltage. The device also includes two latches. The first latch has a first latch output that drives a gate of the p-FET via an inverting circuit element. The second latch has a second latch output that drives a gate of the n-FET via a non-inverting circuit element. The device also includes a reset signal pulse generator that receives the input signal and generates a reset signal pulse in response to a transition in the input signal. Both of the latches are placed in a reset state by the reset signal pulse.

20 Claims, 10 Drawing Sheets

400

500

COMPACT LEVEL SHIFTER

BACKGROUND OF THE INVENTION

A level shifter alters the magnitude of a signal. They are often utilized to convert digital signals operating in one domain to signals in a different domain. For example, a level shifter might take in an analog signal from a circuit operating with a supply voltage of 1 volt, and transfer the signal into a circuit operating with a supply voltage of 2 volts. In this example, each value of the signal in the 1 volt domain would be represented by a factor of two larger value of the signal in the 2 volt domain. As another example, a level shifter might take in a digital signal operating with a transistor-transistor logic level and convert the signal to different domain. Since digital signals are either logic high or logic low values, the transistor-transistor logic level digital signal would be level shifted to a create a new version of the signal with logic high and logic low values equivalent to the logic high and logic low values of the new domain.

A level shifter architecture can be described with reference to the block diagram in FIG. 1 in which circuit 100 is a level shifter. Level shifter 100 shifts a signal Din that varies between a supply voltage 101 and ground 102 to a signal Dout that varies between a high supply voltage 103 and a low supply voltage 104. The magnitude of the difference between the supply voltage and ground is less than the magnitude of the difference between the high and low supply voltages. For example, the supply voltage could be 1.8 volts, ground could be 0 volts, the high supply voltage could be 3.5 volts, and the low supply voltage could be −3.5 volts. Level shifter 100 is double sided because it shifts both the upper and lower bounds of the input signal Din. To do this, it utilizes two different single sided level shifters: positive level shifter 105 and negative level shifter 106. Each of these single sided level shifters has an output connected to the gate of an output buffer device. Positive level shifter 105 is connected to the gate of p-type field effect transistor (p-FET) 107 and negative level shifter 106 is connected to the gate of n-type field effect transistor (n-FET) 108.

A circuit powered by high supply voltage 103 and low supply voltage 104 has the potential to consume more power than a circuit that is powered by supply 101 and ground 102. Furthermore, the high and low supply voltages 103 and 104 are, in the context of an integrated circuit, usually generated on chip using a pump circuit so that the amount of power available at those voltages levels is somewhat limited. Therefore, it is important to assure that p-FET 107 and n-FET 108 are never placed in a conductive state at the same time. If this were so, a short circuit path would exist between high supply voltage 103 and low supply voltage 104 which would burn up a significant amount of power. The short circuit condition described is prevented through the use of phase logic 109. This phase logic controls the times in which a signal is provided to positive level shifter 105 and negative level shifter 106 to assure that their associated output buffer devices (i.e., p-FET 107 and n-FET 108) are never in a conductive state at the same time. Phase logic 109 serves to assure that, during transitions in Din, the output buffer device that is transitioning to a nonconductive state does so before the other output buffer device transitions to a conductive state.

If an inverted version of Dout is desired, additional circuitry is required. An inverted version of Dout can be referred to as Doutn. Placing an inverter at node Dout to generate Doutn is not sufficient for most applications because it is desirable to have a phased matched version of Dout and Doutn available. If a simple inverter was utilized to generate Doutn from Dout, the inverter would introduce a phase difference between the two signals equal to the delay of that inverter. Therefore, a phased matched inverted version must be generated separately and concurrently with the generation of the original non-inverted signal. This is accomplished through the use of two additional output buffer devices: p-FET 110 and n-FET 111; and positive and negative level shifters similar to those used to generate the original signal: positive level shifter 112 and negative level shifter 113.

Common circuits that can be used in place of level shifter 105 and negative level shifter 106 naturally produce complementary output signals. The complementary output signals from these common circuits could have been used to generate the inverted version of the output signal. However, because phase delay was purposefully introduced to the system at an earlier point, these complementary signals will not have the proper phasing for controlling the additional set of output buffer devices such as p-FET 110 and n-FET 111. In other words, while the outputs of level shifter 105 and 106 are appropriately shifted so that output buffer devices 107 and 108 are never on at the same time and power is conserved, if the complementary signals of level shifters 105 and 106 were applied to output buffer devices 110 and 111 they would instead assure that the output buffer devices were on at the same time and that power is wasted.

SUMMARY OF THE INVENTION

Figure 1:
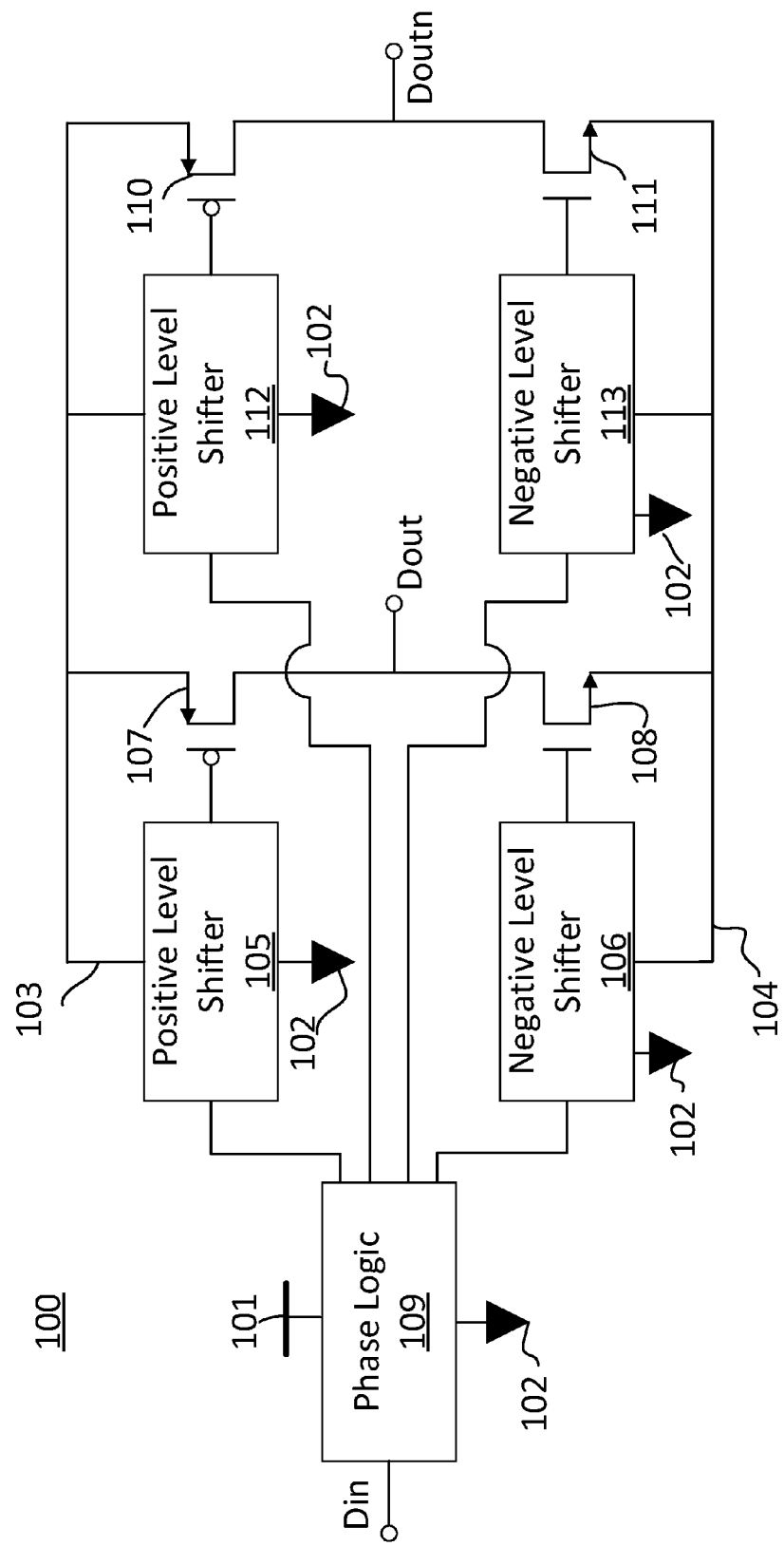
FIG. 1 is a block diagram of a level shifter producing an inverted and non-inverted version of an input signal that is in accordance with the related art.

In specific embodiments of the present invention, a device for level shifting an input signal is provided. The device includes an output buffer that has: an output node, a p-FET coupled to a high reference voltage, and an n-FET coupled to a low reference voltage. The device also includes two latches. The first latch has a first latch output that drives a gate of the p-FET via an inverting circuit element. The second latch has a second latch output that drives a gate of the n-FET via a non-inverting circuit element. The device also includes a reset signal pulse generator that receives the input signal and generates a reset signal pulse in response to a transition in the input signal. Both of the latches are placed in a reset state by the reset signal pulse.

In other embodiments of the present invention a process for level shifting an input signal is provided. The process includes driving an output node between a first voltage and a second voltage using a first buffer output device and a second buffer output device. The process also includes receiving a transition in an input signal between an old state at a third voltage and a new state at a fourth voltage. The process also includes temporarily impeding the new state from being latched using a clear pulse that clears a state of a latch. The process also includes latching the input signal using a latch such that the input signal sets an output state of the latch. The process also includes driving a control node of the first buffer output device according to the output state of the latch. The magnitude of the first voltage is greater than a magnitude of the third voltage.

In other embodiments of the present invention, an apparatus for increasing a magnitude of an input signal is provided. The apparatus includes two output buffer devices. The first output buffer device is connected to a high supply voltage node and is coupled to an output node. The second output buffer device is connected to a low supply voltage node and is coupled to the output node. The apparatus also includes a core circuit having a reset state, a high state, and a low state. The apparatus also includes a reset pulse generator coupled to the core circuit. The core circuit places the first and second output buffer devices in nonconductive states when in the reset state. The core circuit places the first output buffer device in a conductive state and the second output buffer device in a nonconductive state when in the high state. The core circuit places the first output buffer device in a nonconductive state and the second output buffer in a conductive state when in the low state. The reset pulse generator places the core circuit in the reset state upon a transition in the input signal between a low input voltage and a high input voltage. A difference between the high input voltage and the low input voltage is smaller than a difference between the high supply voltage and the low supply voltage.

DETAILED DESCRIPTION

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

The present disclosure relates to electronic circuits. In particular, the present disclosure relates to electronic circuits with output signals having larger magnitudes than their input signals. In the following description, for purposes of explanation, numerous examples and specific details are set forth in order to provide a thorough understanding of the present disclosure. It will be evident, however, to one skilled in the art, that the present disclosure as defined by the claims may include some or all of the features in these examples alone or in combination with other features described below, and may further include modifications and equivalents of the features and concepts described herein.

With reference again to FIG. 1, certain drawbacks of the approaches described previously can be illustrated. In order to produce the inverted version of Doutn, not only must output buffer devices 110 and 111 be added, but another positive level shifter 112 and negative level shifter 113 need to be added as well. Although the addition of this circuitry does effectively generate a phase matched version of Dout on the line marked Doutn, the size of the overall circuit and therefore the cost of the circuit must nearly double. Further, the additional phasing requires an increase in the size of phase logic 109.

Level shifting circuits are disclosed below that can achieve similar functionality, power performance, and speed as prior approaches without the use of phase logic and at lower cost. Some of the circuits are able to achieve similar functionality as those described with reference to FIG. 1 without the use of phase logic. Likewise, some of the circuits are able to decrease the number of level shifters required as those described with reference to FIG. 1.

Some of the level shifters disclosed herein utilize latches that latch transitions in the input signal and that set the condition of an output buffer device based on their current output state. At or about the time the latch receives a transition in the input signal that might otherwise have been latched, a clear signal is sent to the latch. The clear signal affects the current output state of all the latches in the level shifter such that their output states are those in which the buffer devices they control are in nonconductive states. In this manner, the output buffer device that would have otherwise been transitioning to a conductive state is delayed from its transition while the buffer device that was already in a nonconductive state is unaffected. The net result is that the clear pulse prevents situations where two output buffer devices that are coupled between the level shifted voltages are open at the same time. In contrast to the approach described with reference to FIG. 1, the clear pulse prevents high current consumption without the need for phase logic because the pulse naturally handicaps the appropriate transition regardless of which of the two output buffer devices is transitioning to a conductive state.

Some of the level shifters disclosed herein are able to apply the clear signal approach described in the previous paragraph as a substitute to using phase logic while at the same time keeping the power consumption of the device to the same or a lower amount. This is achieved through electrically responsive or logically controlled circuit approaches that place the component portions of the level shifter into low current consumption states when the clear signal pulse is utilized.

Some of the level shifters disclosed herein are able to produce an inverted and non-inverted version of the level shifted signal with reduced area as compared to the approaches described with reference to FIG. 1. Rather than adding additional level shifters, the differential outputs of the level shifters that are used to generate the non-inverted version of the level shifter signal are used to produce the inverted version. The level shifters described herein that do not require phase logic do not face the problems associated with the phase of the differential outputs not matching. Since no phasing is introduced in the first place, the differential outputs can be used to drive buffer output devices that generate the inverted version of the level shifted signal.

Figure 2:
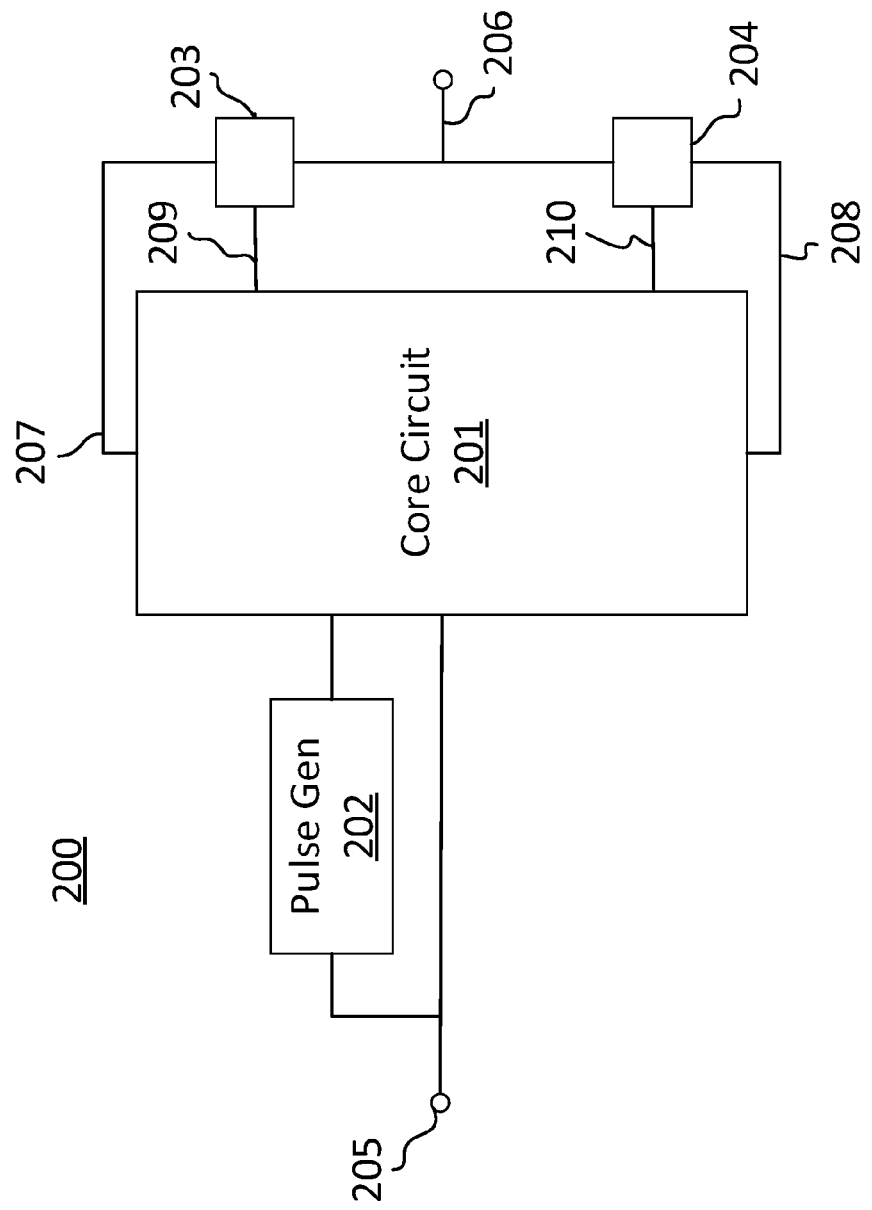
FIG. 2 is a block diagram of a level shifter with a clear pulse generator that is in accordance with embodiments of the present invention.

Level shifters that are in accordance with embodiments of the present invention can be described with reference to FIG. 2. In FIG. 2, a level shifter 200 includes a core circuit 201, a reset pulse generator 202, and two output buffer devices 203 and 204. The level shifter 200 accepts an input signal at node 205 and level shifts the signal to produce an output signal at node 206. The output signal varies between high supply voltage 207 and low supply voltage 208 and the input signal varies between a high input voltage and a low input voltage. The difference between the high supply voltage and the low supply voltage is not equivalent to the difference between the high input voltage and the low input voltage. Although a majority of the embodiments described herein involve situations in which the output voltage swing is larger than the input voltage swing, the benefits of the present invention apply equally to level shifters that decrease the magnitude of the input signal. Output buffer devices 203 and 204 create conductive pathways from the high and low supply voltages to output node 206 respectively in response to signals received on control nodes 209 and 210. To preserve power in the system, both output buffer devices should not be placed in a conductive state at the same time.

Core circuit 201 has three key states in which it can be placed. Core circuit 201 can be placed in a reset state in which both output buffer devices 203 and 204 are in nonconductive states, a high state in which output buffer device 203 is in a conductive state, but output buffer device 204 is in a nonconductive state, and a low state in which output buffer device 204 is in a conductive state, but output buffer device 203 is in a nonconductive state. Core circuit 201 transitions between the high state and low state when the signal on input node 205 transitions between the low input voltage and the high input voltage.

Reset pulse generator 202 is coupled to core circuit 201 and generates a reset pulse every time the signal on input node 205 makes a transition. The time in which reset pulse generator 202 generates the reset pulse is set such that core circuit 201 cannot switch between its high state and low state before the reset pulse forces core circuit 201 into its reset state. As a result, core circuit 201 is forced into its reset state temporarily during each transition of the input signal. For example, if core circuit 201 were transitioning between its low state and its high state, the output buffer device 203 would be poised to turn on and output buffer device 204 would be poised to turn off. If a glitch or manufacturing defect pushed the circuit away from ideal, it is possible that during this transition both output buffer devices 203 and 204 would be in a conductive state at the same time. However, the fact that core circuit 201 is placed into its reset state at the time the input signal transitions means that the both devices will definitely be off before the core circuit is allowed to transition into a state where the new output buffer device is on.

The required reset pulse delivered to core circuit 201 can be created in numerous ways. For example, reset pulse generator 202 could include a delay element connected to the input signal in combination with a logic gate that compared the resulting delayed input signal with the input signal itself. If, for example, the logic gate was an exclusive-or gate the result would be a reset pulse lasting from the transition of the input signal and terminating at the end of the delay provided by the delay element. Furthermore, although FIG. 2 displays a configuration in which reset pulse generator 202 generates the reset pulse based on the input signal, it is possible for the reset pulse to be generated using a system clock that is synchronized with the transitions in the input signal. As long as the reset pulse is delivered upon the transition of the input signal, the detrimental high supply to low supply current state will be avoided. In situations where the reset pulse is generated using a system clock it could be beneficial to deliver the reset pulse upon the transition of the input signal such that it was delivered just prior to the input signal transition. As a result, the reset pulse would not have to race to take effect before the core circuit transitioned between the low state and high state. In situations where the reset pulse is generated using the input signal, it could be beneficial to decrease the delay of the logic gate required to generate the reset pulse so that the reset pulse could affect the core circuit prior to the core circuit transitioning between the low state and the high state. This could be done by designing a custom logic gate for pulse generator 202 that was faster, and perhaps consumed more power, than other logic gates in level shifter 200.

Output buffer devices 203 and 204 can take on various forms. For example, output buffer device 203 could be a p-FET and output buffer device 204 could be an n-FET. In this situation, the drains of the transistors would be coupled to the output node 206 and their sources would be connected to high voltage supply 207 and low voltage supply 208. Notably, the term "coupled" is applied herein in juxtaposition to the term "connected" because there could be intervening circuitry between the output buffer devices and the output node 206 such as isolation transistors or other active or passive elements. The use of isolation transistors would be most relevant where the difference between the high supply voltage and low supply voltage was large such that a single transistor could be damaged if required to hold the full voltage across its terminals. Output buffer devices 203 and 204 could also be bipolar junction transistors, optical devices, MEMS switches, or any other kind of three terminal device that can provide an alternatively conductive and nonconductive pathway between two terminals in response to a signal at a third terminal.

The high supply voltage and low supply voltage could take on various forms, and could have various relationships to the high input voltage and low input voltage. For example, the high supply voltage could be higher than the high input voltage at the same time the low supply voltage was lower than the low input voltage. However, either of these relationships could exist independently. The level shifter could therefore be single ended in either direction or double ended. As a specific example, the high supply voltage could be 3.3 volts, the high input voltage could be 1.8 volts, and the low voltages could both be 0 volts. As another specific example, the high supply voltage could be 3.5 volts, the low supply voltage could be −3.5 volts, the high input voltage could be 2.5 volts, and the low input voltage could be 0 volts.

Core circuit 201 can take various forms. For example, core circuit 201 could include a single differential latch circuit where the states of the differential outputs determined the state of the core circuit 201. The single differential latch could include two cross-coupled p-FET load devices, having cross-coupled nodes gate and drain nodes used as output nodes of the latch, and two common source n-FET devices with gate terminals defining the inputs to the latch and drain terminals coupled separately to the output nodes of the latch. The outputs of the latch would then drive the output buffer devices. Achieving the proper reset state would depend on whether the output devices were complementary or identical. In the case where the output buffer devices were complementary, one of the differential outputs would need to be inverted. For example, in the situation where output buffer device 203 was a p-FET and output buffer device 204 was an n-FET, the differential latch described above would need to have a non-inverting buffer placed in-between one of its output nodes and the gate of one of the FETs for the device to exhibit the proper high and low states described above. Importantly, the core circuit in these situations will be placed into the reset state by providing the reset pulse to the gates of the aforementioned common source n-FET devices such that both output nodes of the latch were pulled low in response to the reset pulse.

Another potential form for core circuit 201 could include two latches. The two latches could include a first latch coupled between the high supply voltage and the ground voltage and a second latch coupled between the ground voltage and the low supply voltage. The voltage domain of the output node for the first latch would therefore be ground to the high supply voltage while the domain of the output node for the second latch would be the low supply voltage to ground. The output nodes of each of these two latches would then define the state of the core circuit. As in the single latch implementation described above, achieving the proper reset state would depend on whether the output devices were complementary or identical. In keeping with the example above, if output buffer device 203 were a p-FET, the proper reset state with regards to the first latch would be achieved when the output of the first latch was at the high supply voltage, or when the output of the first latch was at the ground voltage and was inverted in the first latch's voltage domain before being delivered to control node 209. Likewise, if the output buffer device 204 were an n-FET, the proper reset state with regards to the second latch would be achieved when the output of the second latch was at the low supply voltage, or when the output of the second latch was at the ground voltage and was inverted in the second latch's voltage domain before being delivered to control node 210.

Figure 3:
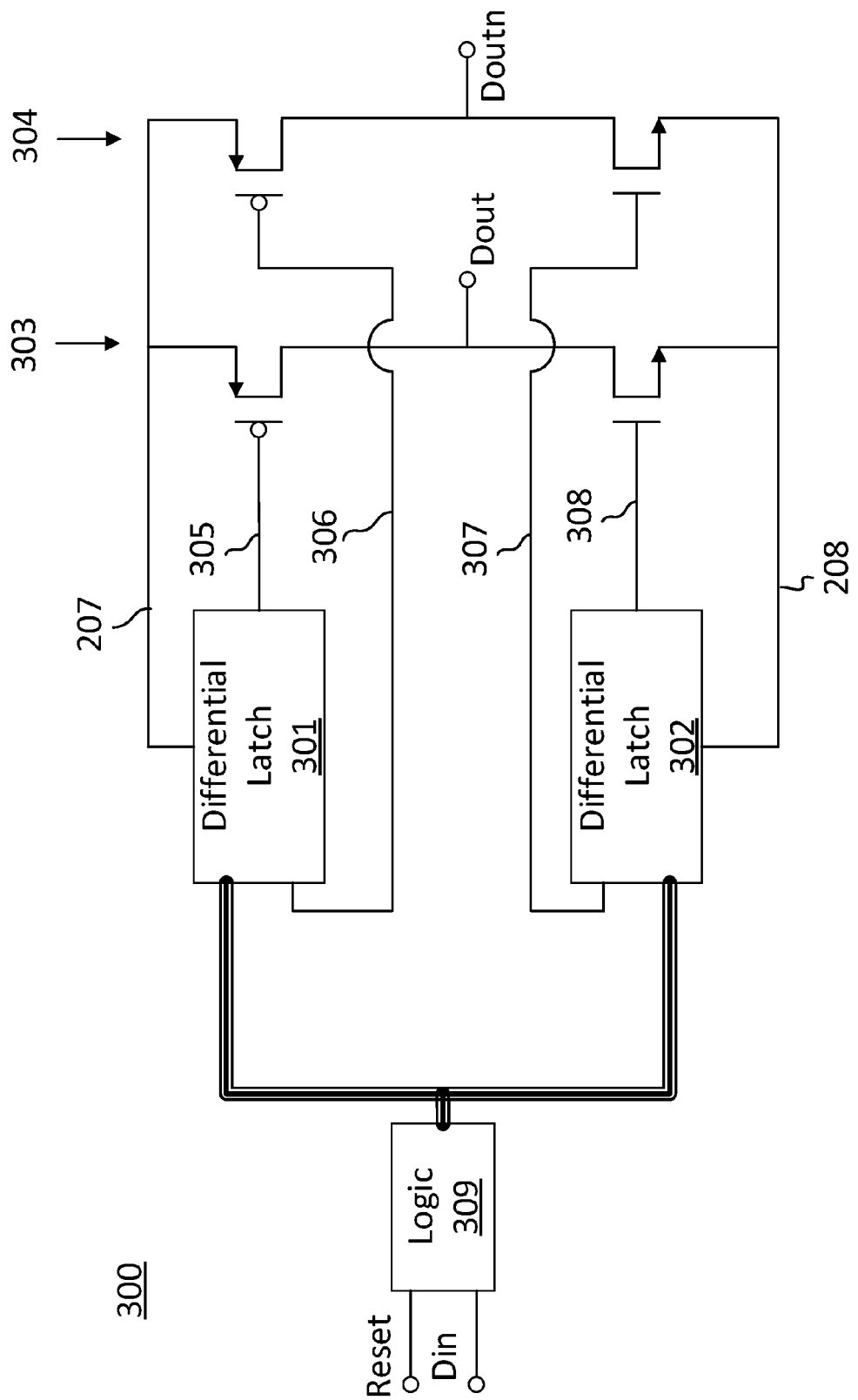
FIG. 3 is a block diagram of a level shifter with an inverted and non-inverted output that is in accordance with embodiments of the present invention.

Additional level shifters that are in accordance with embodiments of the present invention can be described with reference to FIG. 3. FIG. 3 displays a level shifter 300 having two differential latches 301 and 302 and two sets of output buffer devices 303 and 304. The two differential latches can match the characteristics of the latches described above in terms of their configuration and reset states. The level shifter 300 is an improvement over other approaches where four latches or sub-level shifters are required to generate phase-matched inverted (Doutn) and non-inverted (Dout) versions of a level shifted signal.

Differential latches 301 and 302 each have an output that drives one of the buffer output devices in each set of buffer devices 303 and 304. Differential latch 301 drives buffer output devices 303 via output 305 and buffer output devices 304 via output 306. Differential latch 302 drives buffer output devices 303 via output 307 and buffer output devices 304 via output 308. The reason the differential outputs of the two differential latches 301 and 302 can be used to generate an inverted version of the output signal Doutn is that phase logic was not used to produce the original level shifted output signal. Since the reset state is now agnostic to the phase of the input signals and the direction of their transitions, the differential outputs of the latches can be used to produce an inverted version of the output signal. As long as latches 301 and 302 are configured such that both outputs of each individual inverter reset to the same value, the differential outputs can be used to produce the inverted version of the output signal Doutn.

The control signals for the differential latch 301 and 302 are generated using logic 309. Logic 309 is drawn as a separate block that is shared by both latch 301 and 302, but each block could have its own separate logic block to perform the function of logic 309. The connection from logic 309 to differential latch 301 and 302 is drawn as a bus to represent the fact that multiple signals are generally required as inputs to the differential latches. Common circuits for differential latches 301 and 302 generally require differential inputs. Logic 309 can therefore generate an inverted version of Din and pass both Din and the inverted version of Din to both differential latch 301 and differential latch 302. Logic 309 can also take in the reset signal and use it as an override for Din and the inverted version of Din such that the circuit lines that pas Din and the inverted version of Din will be set to a common value when the reset signal is high. For example, logic 309 could set Din and the inverted version of Din both to ground when the reset signal is high. Logic 309 can also pass the reset signal on to differential latch 301 and 302 as a separate signal if either latch needs the signal for separate functionality. As described below, differential latch 301 and 302 may need reset signal sent along a separate signal line so that it can be used to put the latches in a low current consumption state when the reset signal is high.

Differential latches 301 and 302 in combination with logic 309 can serve to take the place of core circuit 201 in FIG. 2. FIG. 2 is drawn with a single output buffer, but it could be modified to include two output buffers both being controlled by output from core circuit 201. In that case, outputs 305-08 would provide the four outputs from core circuit 201. Also, FIG. 3 is drawn with inverted and non-inverted versions of the output signal being produced, but output lines 306 and 307 could be removed from FIG. 3. The remaining circuitry from differential latches 301, differential latch 302, and logic 309 would be a line for line match with core circuit 201 and such a configuration would be in accordance with embodiments of the present invention.

Figure 4:
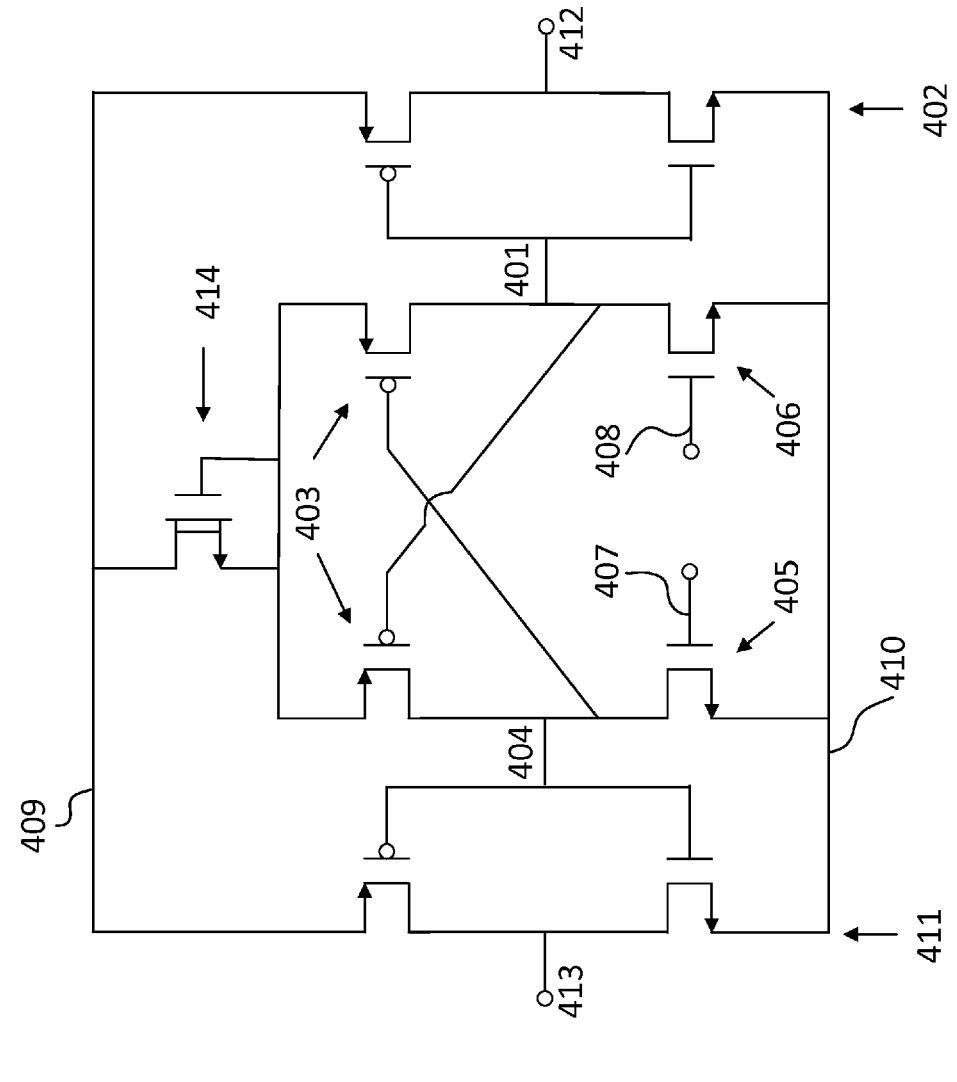
FIG. 4 is a block diagram of a differential latch that can be used in place of differential latch 301 in FIG. 3 that is in accordance with embodiments of the present invention.

FIG. 4 illustrates a differential latch 400 that can be used in accordance with embodiments of the present invention. Differential latch 400 includes a positive output 401 that can be used to drive the gate of a p-FET output buffer device via an inverting circuit element such as inverter 402. Differential latch 400 also includes a pair of cross-coupled p-type FETs 403 having a shared source connection and cross-coupled gate and drain connections. The cross-coupled connections are separately connected to positive output 401 and negative output 404. Latch 400 also includes a pair of n-FETs 405 and 406 having a share source connection to a ground voltage. The n-FETs receive the input signals for the differential latch at their gate terminals 407 and 408.

Differential latch 400 can be used in place of latch 301 in FIG. 3. In this configuration, supply 409 is the high voltage supply 207, node 410 is ground, and gate terminals 407 and 408 are connected to logic 305 via two separate circuit lines. The differential latch drives the p-FET output buffer devices in output buffers 303 and 304 via inverting circuit elements in the form of buffers 402 and 411 that drive outputs 412 and 413. Output 421 is connected to output 305, and output 413 is connected to output 306.

The operation of differential latch 400 as used in place of latch 301 in FIG. 3 will now be described. Importantly, the reset pulse will bring the gate terminals 407 and 408 to a high state which will set the positive and negative outputs 401 and 404 to ground voltage 410. These outputs will then drive the gates of the p-FETs in output buffers 303 and 304 to the high supply voltage because inverter 402 and 411 are supplied by the high supply voltage 409. In this manner, the reset pulse causes differential latch 400 to place both of the devices it controls in the output buffers in nonconductive state. When the reset pulse is not engaged, logic 305 will pass the input signal in inverted form to gate terminal 407 and in non-inverted form to gate terminal 408. Since the input signal will thereby be applied differentially across the gates of n-FETs 405 and 406, differential latch 400 will latch the input signal such that it appears differentially across output 401 and output 404. For example, if the input signal is high, n-FET 406 will go to a conductive state and n-FET 405 will go to a nonconductive state. Then, the cross-coupled p-FETs 403 will latch the state of the output nodes such that output 401 will be driven to ground and output 404 will be driven to high supply voltage 409. In a similar fashion, the opposite output state will result if the input signal is low with output 401 driven to the high supply voltage and output 404 driven to ground. Therefore, when the reset pulse is not high the input signal will be passed through differential latch 400 and will turn on the p-FET in output buffer 303 and turn off the p-FET in output buffer 304 if the input signal is high, and will turn off the p-FET in output buffer 303 and turn on the p-FET in output buffer 304 if the input signal is low.

Depletion mode transistor 414 serves to limit the power consumed by differential latch 400 in the reset state. Since the gates of both n-FETs 405 and 406 are high in the reset state, both the cross-coupled p-FETs 403 and the n-FETs will be conductive and capable of sinking a large amount of current from supply 409. However, latch 400 includes depletion mode transistor 414 which serves to limit the current drawn from high voltage supply 409 in the reset state. Depletion mode transistors have threshold voltages below 0 volts and they therefore conduct when their gate to source voltages are equal to zero. Therefore, when differential latch 400 is in its regular operating state, depletion mode transistor 414 is serving as a load, but when the latch is placed in its reset state, depletion mode transistor 414 limits the supply current and allows the latch to collapse.

Figure 5:
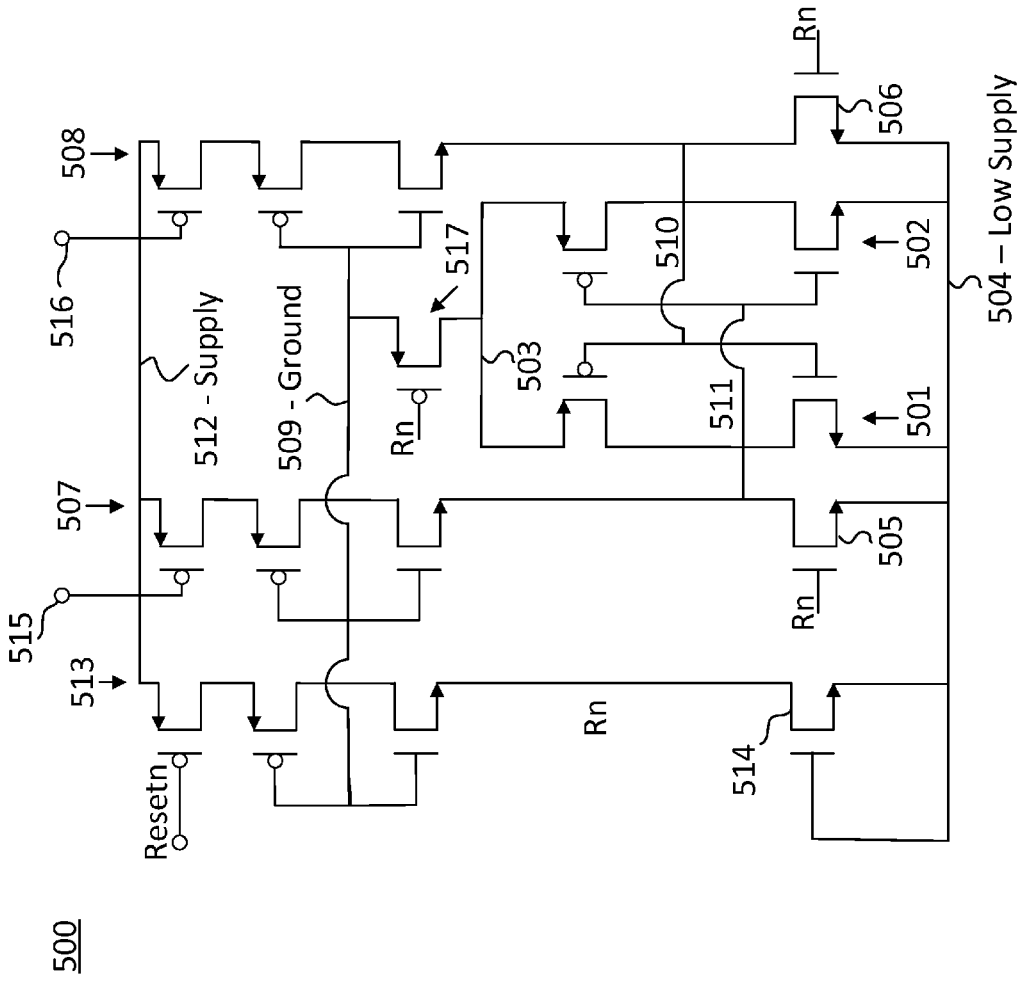
FIG. 5 is a block diagram of a differential latch that can be used in place of differential latch 302 in FIG. 3 that is in accordance with embodiments of the present invention.

FIG. 5 illustrates a differential latch 500 that can be used in accordance with embodiments of the present invention. Differential latch 500 includes a pair of inverters 501 and 502 having a shared p-type source connection 503 and a shared n-type source connection to a low reference voltage 504. The output of each inverter is connected to the input of the other inverter. Differential latch 500 also includes a pair of n-FETs 505 and 506. The drain of transistor 505 is connected to the output of inverter 501 and the input of inverter 502. The drain of transistor 506 is connected to the output of inverter 502 and the input of inverter 501. Current sources 507 and 508 provide current inputs for the latch.

Differential latch 500 can be used in place of latch 302 in FIG. 3 such that supply 509 is the ground voltage in FIG. 3 and the low reference voltage 504 is the low supply voltage 208. In this situation, the cross-coupled input output nodes of inverters 501 and 502 form negative output 510 and positive output 511 which serve as the outputs 307 and 308 of latch 302 respectively. Notably, the particular differential latch 500 also may require an input for the supply voltage in FIG. 3 which is not shown as a connection in in that Figure. The supply is used to power node 512 in FIG. 5. Differential latch 500 may also require the signal reset to be inverted and delivered on an independent signal line from logic 309 to control current source 513.

When the latch is used in place of latch 302, the reset pulse will bring the gates of n-FETs 505 and 506 to ground. This particular circuit assumes that the reset pulse swings from ground to supply and therefore requires a transform to bring the signal into the ground to low supply voltage domain. This transform is handled by current source 513 in combination with load transistor 514. When the reset pulse goes high, the node marked Resetn will be set to ground. The Resetn node carries and inverted version of the reset signal and is coupled to logic 309 as described in the previous paragraph. As a result the load transistor 514 will act as a load and the node marked Rn will swing from the low supply voltage 504 up towards the ground voltage 509. As seen in FIG. 5, the Rn signal is routed to the gates of transistors 505 and 506 which is how the reset pulse ultimately brings the gates of n-FETs 505 and 506 to ground. Once these gates have been driven to ground, the positive and negative outputs 511 and 510 will be pulled to the low supply voltage 504. These outputs will then in turn drive the gates of the n-FETs in output buffers 303 and 304 to the low supply voltage. As a result, the reset pulse will turn off the conductive path from the output nodes of the level shifter to the low supply voltage.

When the reset pulse is not high, the output state of differential latch 500 will be determined by the input signal. The input signal will be applied differentially to the latch via logic 309 with a non-inverted version being to node 515 and an inverted version applied from to node 516. The application of the signal to these nodes will then apply the input signal to the core of the latch via current sources 507 and 508 which will set either the positive or negative outputs of the latch to the low supply voltage 504 depending on whether the input signal is at the low input voltage or the high input voltage. If, for example, the positive input is set to the low input voltage and the negative input is set to the high input voltage, a current will flow through current source 507 while no current will flow through current source 508. In turn output node 511 will charge up, causing the cross-coupled inverters 501 and 502 to latch the output node 511 to ground while output node 510 is pulled to the low supply voltage.

Transistor 517 serves to limit the current consumed by differential latch 500 when it is set in its reset state. Differential latch 400 is similar to differential latch 500 in that they both have conductive paths that burn a significant amount of power in the reset state. Current limiting is therefore needed in differential latch 500 for the same reasons as it is in differential latch 400. In contrast to differential latch 400, the current limiting provided by transistor 517 is generated through logic rather than through an electrically responsive circuit. Note that the signal Rn is routed to the gate of transistor 517 in FIG. 5. Therefore, the reset pulse drives the gate of transistor 517 in the same way that it drives the gates of devices 505 and 506. However, since transistor 517 is a p-FET, the same reset pulse acts to turn off transistor 517 and therefore keep the conductive path provided by the p-FETS in inverters 501 and 502 and the n-FETS 505 and 506 from burning current.

Current limiting in the reset state can be accomplished through various techniques. For example, the type of technique applied to limit current in differential latch 400 could be applied to differential latch 500 and vice versa. Differential latch 500 used a logic based technique but it could have used an electrically responsive circuit instead. Differential latch 400 used an electrically responsive circuit to limit current, but it could have used logic circuit. For example, the depletion mode transistor 414 in FIG. 4 could be replaced with a standard enhancement mode n-FET transistor that could be controlled by a signal similar to the one applied to transistor 517 in FIG. 5. In addition, other methods and structures can be applied instead of depletion mode transistors. Resistors or a standard enhancement mode transistor could be used in place of transistors 414 and 517 to limit current though these approaches would likely exhibit higher current consumption or a slower speed for the same level of current consumption.

Figure 6A:
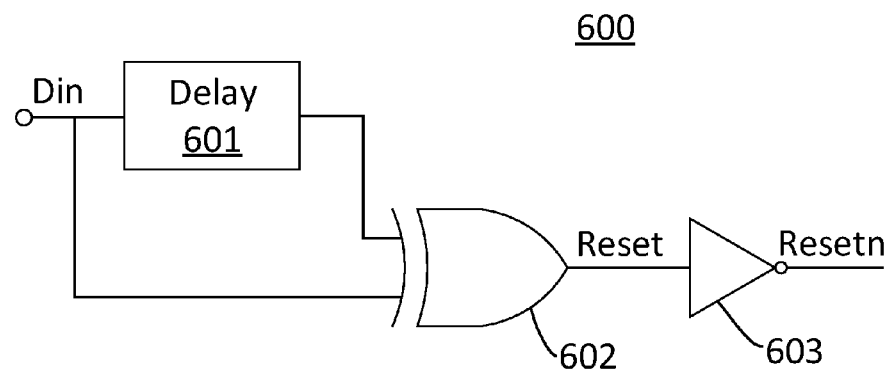
FIG. 6a is a block diagram of a logic circuit that can be used in place of logic 309 in FIG. 3 that is in accordance with embodiments of the present invention.

FIG. 6a illustrates a circuit 600 that can be used in place of pulse generator 202 in FIG. 2. Circuit 600 includes a delay element 601 which can introduce a process dependent delay, or it can generate a delay based on an applied clock signal. Circuit 600 also includes an exclusive OR gate 602 that takes in the input signal Din and the delayed version of the input signal. The exclusive OR gate 602 generates the Reset pulse required by the circuit. The length of the pulse is equal to the duration of the delay introduced by delay element 601. Circuit 600 also includes inverter 603 for generating the inverted version of the reset signal Resetn.

Figure 6B:
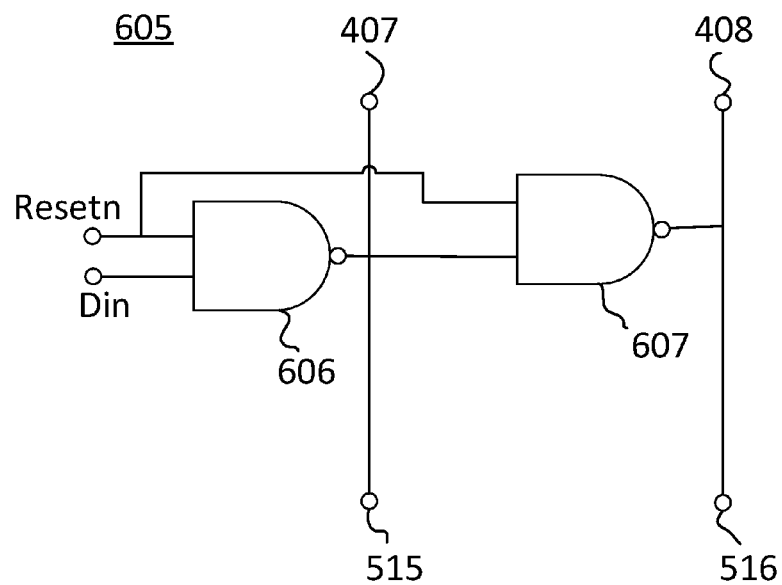
FIG. 6b is a block diagram of a clear pulse generator that can be used in place of pulse generator 202 in FIG. 2.

FIG. 6b illustrate a circuit 605 that can take the place of logic 309 in FIG. 3. Circuit 605 includes two not AND (NAND) gates 606 and 607. NAND gate 605 takes in the Reset and input signal Din and generates an output signal. FIG. 6b is annotated as it logic 309 was providing signals to the differential latches shown in FIGS. 4 and 5. The output signal of NAND 606 could be, in those embodiments, connected to nodes 407 and 515 as indicated. NAND gate 607 takes in the Resetn signal and the output of NAND gate 606 and generates an output that could be, in the same embodiments, connected to nodes 408 and 516 as indicated.

Figure 7:
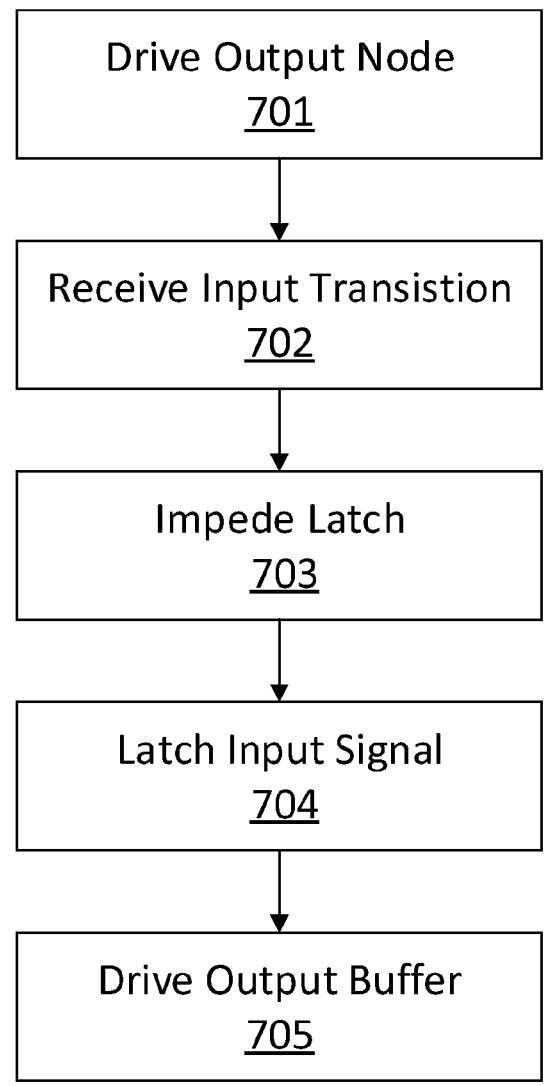
FIG. 7 is a flow chart of a process for operating a level shifting circuit that is in accordance with embodiments of the present invention.

FIG. 7 illustrates a process 700 for level shifting an input signal that is in accordance with embodiments of the present invention. In step 701, an output node is driven between a first voltage and a second voltage using a first buffer output device and a second buffer output device. The first and second buffer output devices provide a switchable conducting or nonconducting path from the first and second voltages to the output node respectively. The buffer output devices can be an n-FET and a p-FET. In step 702, a transition in an input signal is received. The transition is between a third and fourth voltage. The magnitude of the first voltage is greater than the magnitude of the third voltage such that the output signal is a level shifted version of the input signal. The input signal is coupled to the input of a latch. The latch could be in core circuit 201 in FIG. 2 above and the transition in the input signal could be received at input 203. In step 703, the transition in the input signal is kept from being latched temporarily using a clear pulse that clears the state of the latch. As the state of the latch is cleared throughout the duration of the clear pulse, the input signal cannot be latched for that period of time. In step 704, the input signal is latched such that the input signal sets the output state of the latch. For example, if the input signal was a high voltage, the output state of the latch would be high but if the input signal was a low voltage the resulting output state of the latch would also be low. In step 705, a control node of one of the buffer output devices is driven according to the output state of the latch. The control node of the buffer output device will determine whether or not the device is conductive. As such, the latched input signal will set the output state of the latch and ultimately determine if the buffer output devices are conducting.

In specific embodiments of the invention, the clear state of the latch will set both the first and second buffer output devices in a nonconductive state. Therefore, during step 703 both buffer output devices will be off and the output node will be isolated from both the first and second voltages. Then, when the input signal is latched, the output state of the latch will force one of the output buffer devices to provide a conductive path and the other to provide a nonconductive path. Since the clear pulse was delivered upon the transition of the input signal, the output buffer device that provides a conductive path will have been providing a nonconductive path prior to the transition of the input signal. In other embodiments of the invention, two latches will be used and the clear state of both latches will be required to set both the first and second buffer output devices in a nonconductive state. The input signal will still ultimately control which output buffer device provides a conductive path, but it will now have to do so through the use of the two different latches.

Figure 8:
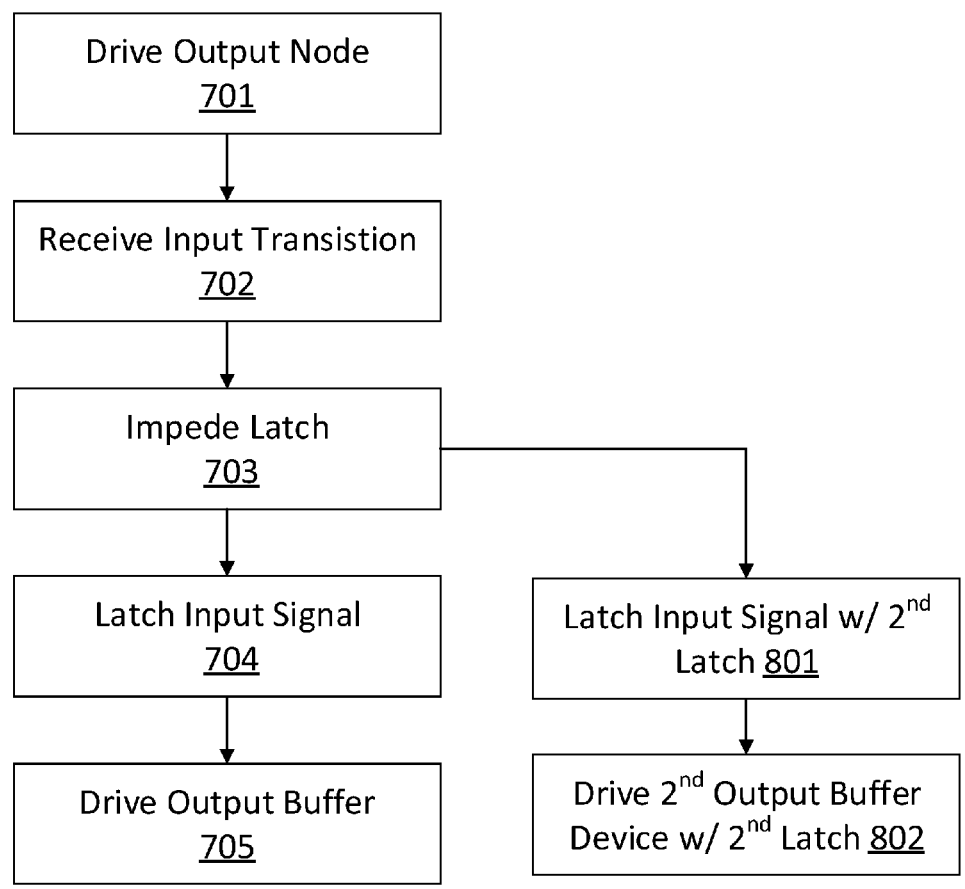
FIG. 8 is a flow chart of a process for operating a bi-directional level shifting circuit that is in accordance with embodiments of the present invention.

FIG. 8 illustrates a process 800 for level shifting an input signal that is in accordance with the present invention. The process contains several of the steps described above with reference to FIG. 7. However, the process also includes the step 801 of latching the input using a second latch thereby setting an output state of the second latch. The process also includes the step 802 of driving a control node of the second buffer output device according to the output state of the second latch. Steps 801 and 802 are placed in parallel with their corresponding steps in process 700 because the steps can be conducted simultaneously with each other, not because there is a choice in the flow between one set of steps or the other. In this method, the magnitude of the first voltage is greater than the magnitude of the third voltage and the magnitude of the second voltage is greater than the magnitude of the fourth voltage such that the output signal is a double sided level shifted version of the input signal.

Figure 9:
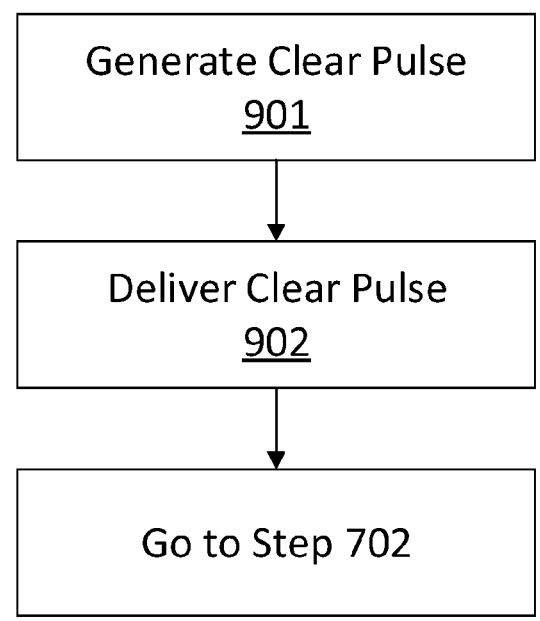
FIG. 9 is a flow chart of a process for generating a clear pulse for a level shifter using a clock signal that is in accordance with embodiments of the present invention.

The clear pulse can be generated using a system clock signal or it can be generated using a delay element in combination with combinatorial logic. FIG. 9 illustrates a process 900 for generating the clear pulse using a clock. In step 901, the clear pulse is generated using a clock. In step 902, the clear pulse is delivered to the latch. After step 902, the method can proceed to step 702 in FIG. 7 such that the clear pulse is delivered prior to receiving the transition in the input signal. Since the clear pulse is not generated from the input signal it can be delivered independent of the timing of the input signal.

Figure 10:
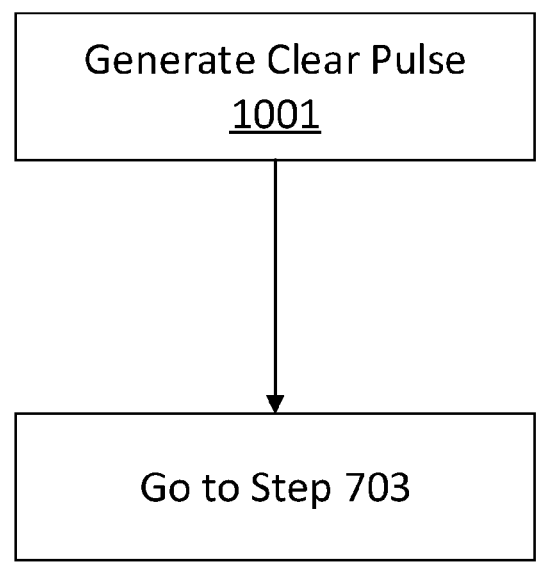
FIG. 10 is a flow chart of a process for generating a clear pulse for a level shifter using an input signal that is in accordance with embodiments of the present invention.

FIG. 10 illustrates a process 1000 for generating a clear pulse from an input signal using a delay element. In step 1001 the clear pulse is generated from the input signal transition using a delay element. Step 1001 will generally succeed step 702 in which the input signal transition is received. However, it could be possible for step 1001 to precede step 702 if the input signal transition is received by the delay element prior to being received by the remainder of the level shifter. For example, delay elements could be added to the level shifter to assure that the clear pulse was already in the process of being formed or was already delivered to the level shifter by the time the input signal transition was received. In either method 900 of 1000, the clear pulse could also be delivered concurrently with the input signal transition or soon enough after the input signal transition so as to not allow the latches to reach an unstable state or to latch the input signal and alter that state of one of the output buffers from a nonconductive state to a conductive state.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims Although embodiments of the invention have been discussed primarily with respect to specific embodiments thereof, other variations are possible. Various configurations of the described system may be used in place of, or in addition to, the configurations presented herein. Those skilled in the art will appreciate that the foregoing description is by way of example only, and is not intended to limit the invention. For example, the techniques and approaches described herein would work equally well with electronic circuits, optical circuits, or any other circuit type that would benefit from the ability to modify the amplitude of a signal. Furthermore, nothing in the disclosure should indicate that the invention is limited to systems and methods that involve field effect transistors as any other kind of circuit technology could be employed in combination with the inventive concepts described herein. In general, any diagrams presented are only intended to indicate one possible configuration, and many variations are possible. Those skilled in the art will also appreciate that methods and systems consistent with the present invention are suitable for use in a wide range of applications encompassing any related to altering the magnitude of signals.

The above examples and embodiments should not be deemed to be the only embodiments, and are presented to illustrate the flexibility and advantages of the present disclosure as defined by the following claims. Based on the above disclosure and the following claims, other arrangements, embodiments, implementations and equivalents will be evident to those skilled in the art and may be employed without departing from the spirit and scope of the disclosure as defined by the claims.

What is claimed is:

1. A device for level shifting an input signal comprising:
an output buffer having an output node, a p-type field effect transistor coupled to a high reference voltage, and an n-type field effect transistor coupled to a low reference voltage;
a first latch having a first latch output, said first latch output driving a gate of said p-type field effect transistor via an inverting circuit element;
a second latch having a second latch output, said second latch output driving a gate of said n-type field effect transistor; and
a reset signal pulse generator receiving said input signal and generating a reset signal pulse in response to: (1) a transition in said input signal from a high input voltage to a low input voltage, and (2) a transition in said input signal from said low input voltage to said high input voltage;
wherein both said first and said second latches are placed in a reset state by said reset signal pulse.

2. The device of claim 1, wherein:
said high reference voltage is higher than said high input voltage;
said low reference voltage is lower than said low input voltage;
said first latch output is set to a ground voltage when placed in said reset state; and
said second latch output is set to said low reference voltage when placed in said reset state.

3. The device of claim 1, further comprising:
a second output buffer having an inverted output node, a second p-type field effect transistor coupled to said high reference voltage and an n-type field effect transistor coupled to said low reference voltage;
wherein:
a complementary first output of said first latch drives a gate of said second p-type field effect transistor via a second inverting circuit; and
a complementary second output of said second latch drives a gate of said second n-type field effect transistor.

4. The device of claim 3, said first latch comprising:
a pair of p-type field effect transistors having: (1) a shared source connection and (2) cross-coupled gate and drain connections, said cross-coupled connections being separately connected to a positive first latch output and a negative first latch output; and
a pair of n-type field effect transistors having a shared source connection to said ground voltage;
wherein:
said positive first latch output is said first latch output; and
said negative first latch output is said complementary first output of said first latch.

5. The device of claim 4, said first latch further comprising:
a depletion mode transistor having a drain connection to said high reference voltage, a gate connection to said shared source connection of said pair of p-type field effect transistors, and a drain connection to said shared source connection of said pair of p-type field effect transistors;
wherein said reset signal pulse drives a gate of both n-type field effect transistors in said pair of n-type field effect transistors to said ground voltage.

6. The device of claim 3, said second latch comprising:
a pair of inverters having a shared p-type source connection, a shared n-type source connection, and a pair of cross-coupled input and output nodes;
a pair of n-type field effect transistors having a shared source connection to said low reference voltage, each n-type field effect transistor in said pair of n-type field effect transistors being separately connected to one of said cross-coupled input and output nodes in said pair of cross-coupled input and output nodes;
wherein one of said cross-coupled input and output nodes in said pair of cross-coupled input and output nodes is said second latch output.

7. The device of claim 6, said second latch further comprising:
a p-type field effect transistor having a source connection to said ground voltage, a gate node, and a drain connection to said shared p-type source connection of said pair of inverters;
wherein said reset signal pulse drives said gate node to said ground voltage and drives a gate of both n-type field effect transistors in said pair of n-type field effect transistors to said low reference voltage.

8. The device of claim 7, wherein said gate node is driven to said low reference voltage in the absence of said reset signal pulse.

9. A process comprising:
driving an output node between a first voltage and a second voltage using a first buffer output device and a second buffer output device;
receiving a transition in an input signal, said transition being between an old state at a third voltage and a new state at a fourth voltage;
impeding said new state from being latched, temporarily, using a clear pulse that clears a state of a latch;
latching said input signal using said latch, said input signal setting an output state of said latch; and
driving a control node of said first buffer output device according to said output state of said latch;
wherein a magnitude of said first voltage is greater than a magnitude of said third voltage.

10. The process of claim 9, further comprising:
latching said input signal using a second latch, said input signal setting an output state of said second latch; and
driving a control node of said second buffer output device according to an output state of said second latch;
wherein:
a magnitude of said second voltage is greater than a magnitude of said fourth voltage; and
said clear pulse clears a state of said second latch.

11. The process of claim 10, wherein:
said first buffer output device is a p-type field effect transistor; and
said second buffer output device is an n-type field effect transistor.

12. The process of claim 9, further comprising:
generating said clear pulse using a clock signal; and
delivering said clear pulse to said latch prior to receiving said transition in said input signal.

13. The process of claim 9, further comprising generating said clear pulse from said transition in said input signal using a delay element.

14. An apparatus for increasing a magnitude of an input signal, comprising:
a first output buffer device connected to a high supply voltage and coupled to an output node;
a second output buffer device connected to a low supply voltage and coupled to said output node;
a core circuit having a reset state, a high state, and a low state; and
a reset pulse generator coupled to said core circuit;
wherein:
said core circuit places: (1) said first and second output buffer devices in nonconductive states when in said reset state; (2) said first output buffer device in a conductive state and said second output buffer device in a nonconductive state when in said high state; and (3) said first output buffer device in a nonconductive state and said second output buffer in a conductive state when in said low state;
said reset pulse generator places said core circuit in said reset state upon a transition in said input signal between a low input voltage and a high input voltage; and
a difference between said high input voltage and said low input voltage is smaller than a difference between said high supply voltage and said low supply voltage.

15. The apparatus of claim 14, said reset pulse generator comprising:
a delay element connected to said input signal, said delay element producing a delayed input signal;
wherein:
said reset pulse generator generates a reset pulse from said delayed input signal; and
said reset pulse places said core circuit in said reset state faster than said core circuit can respond to a transition in said input signal.

16. The apparatus of claim 14, wherein:
said first output buffer device is a p-type field effect transistor, said p-type field effect transistor being source connected to said high voltage supply and gate connected to said core circuit at a p-type gate node; and
said second output buffer device is an n-type field effect transistor; said n-type field effect transistor being source connected to said low voltage supply and gate connected to said core circuit at an n-type gate node.

17. The apparatus of claim 16, wherein:
said low supply voltage is lower that said low input voltage; and
said high supply voltage is higher than said high input voltage.

18. The apparatus of claim 17, said core circuit comprising:
a first latch having a first latch output and being coupled between said high supply voltage and a ground voltage; and
a second latch having a second latch output and being coupled between said ground voltage and said low supply voltage;
wherein:
said first latch output drives said p-type gate node towards said high supply voltage when said core circuit is in said reset state; and
said second latch output drives said n-type gate node towards said low supply voltage when said core circuit is in said reset state.

19. The apparatus of claim 18, further comprising:
a third buffer output device connected to a high supply voltage node and coupled to an inverted output node;
a fourth buffer output device connected to a low supply voltage node and coupled to said inverted output node;
a third latch output for said first latch, said third latch output and said first latch output being differential outputs for said first latch; and
a fourth latch output for said second latch; said fourth latch output and said second latch output being differential outputs for said second latch;
wherein:
said third latch output places said third buffer output device in a nonconductive state when said core circuit is in said reset state; and
said fourth latch output places said fourth buffer output device in a nonconductive state when said core circuit is in said reset state.

20. The apparatus of claim 19, wherein:
said p-type field effect transistor is drain connected to a first isolation transistor;
said n-type field effect transistor is drain connected to a second isolation transistor; and
said first and said second isolation transistors are connected to said output node.

* * * * *